United States Patent [19]

Uchida

[11] 4,123,771

[45] Oct. 31, 1978

[54] NONVOLATILE SEMICONDUCTOR MEMORY

[75] Inventor: Yukimasa Uchida, Yokohama, Japan

[73] Assignee: Tokyo Shibaura Electric Co., Ltd., Kawasaki, Japan

[21] Appl. No.: 705,561

[22] Filed: Jul. 15, 1976

Related U.S. Application Data

[63] Continuation of Ser. No. 507,611, Sep. 19, 1974, abandoned.

[30] Foreign Application Priority Data

Sep. 21, 1973 [JP] Japan ................ 48-106793

[51] Int. Cl.² ............ H01L 29/78; H01L 27/02; H01L 29/34; H03K 5/00
[52] U.S. Cl. ...................... 357/23; 357/13; 357/41; 357/54; 307/238
[58] Field of Search ............ 357/13, 23, 41, 54; 307/238

[56] References Cited

U.S. PATENT DOCUMENTS

| | | | |
|---|---|---|---|
| 3,345,216 | 10/1967 | Rodgers et al. | 357/23 |
| 3,513,364 | 5/1970 | Heiman | 357/23 |
| 3,718,916 | 2/1973 | Wada et al. | 357/23 |
| 3,797,000 | 3/1974 | Agusta | 307/238 |
| 3,868,187 | 2/1975 | Masuoka | 357/23 |
| 3,868,721 | 2/1975 | Davidsohn | 357/41 |
| 3,893,151 | 7/1975 | Bosselaar et al. | 357/41 |
| 4,019,198 | 4/1977 | Endo et al. | 357/23 |

OTHER PUBLICATIONS

Terman "Floating Aualance-Injection Metal-Oxide Semiconductor Device with Low Write Voltage" IBM Tech. Disclosure Bulletin vol. 14(5/72)p. 3721.

Anantha et al., "Single Fet Memory Cell with Buried Extended Source" IBM Tech. Disclosure Bulletin vol. 16 (1/74) p. 2708-2709.

*Primary Examiner*—William D. Larkins
*Assistant Examiner*—Gene M. Munson
*Attorney, Agent, or Firm*—Cushman, Darby & Cushman

[57] ABSTRACT

A nonvolatile semiconductor memory having an insulated gate field effect transistor whose structure is so made as to permit, during the write operation, a substrate surface region below the gate to be substantially enclosed by depletion layers extended from the source and drain regions or by said depletion layers and a channel formed between said regions, thereby increasing a resistance between the substrate and said substrate surface region to decrease the writing current in amount and the writing voltage in level.

2 Claims, 10 Drawing Figures

NONVOLATILE SEMICONDUCTOR MEMORY

This is a continuation, of application Ser. No. 507,611 filed Sept. 19, 1974, now abandoned.

This invention relates to a nonvolatile semiconductor memory having an insulated gate field effect transistor construction.

A so-called MNOS memory is known as a typical example of this type of semiconductor memory. This semiconductor memory is a metal-nitride-oxide-semiconductor (MNOS) memory so constructed as to have a $p^+$ type source region 2 and drain region 3 in an $n$ type silicon substrate 1, a gate insulation film bridged between said both regions 2, 3 and prepared by laminating an oxide film ($SiO_2$) 4 having an extremely small thickness and a silicon-nitride film ($Si_2N_4$) 5, and further source, gate and drain electrodes 6, 7 and 8, as shown in FIG. 1. The writing of information in said MNOS memory is performed utilizing together the avalanche effect and tunnel effect, that is avalanche-tunnel injection, as follows. Namely the $n$-type substrate 1 and gate are grounded while a negative voltage having a prescribed level is applied to the drain 1 and source 2 junctions. As the result, an avalanche breakdown occurs at the surface portions of the source and drain junctions, and hot electrons produced due to this avalanche breakdown are injected into electron traps within a portion of the silicon-nitride film 5 in the neighborhood of the interface between the films 4 and 5, thereby increasing an electron concentration in the traps near the source and drain regions. Simultaneously, a current is flowed from the avalanche breakdown region to the interior of the substrate 1 due to the production of avalanche plasma at the surface of the substrate 1, thereby producing a voltage drop, so that the potential of the surface region of the substrate right below the gate electrode approaches that of a voltage applied to the source and drain regions 2 and 3. As the result, electrons are also injected into traps in the vicinity of the center of the gate electrode, far from the source and drain regions 2 and 3 due to the tunnel effect produced in the silicon-oxide film 4. In this manner, injection of electrons into traps within the silicon-nitride film 5 extending along the entire length of the gate electrode region is effected to cause the threshold voltage of the gate electrode to be shifted in a positive direction. If this threshold voltage shifted in a positive direction is defined as, for example, "1," and the threshold voltage shifted in a negative direction is defined as, for example, "0," two values of information "1" and "0" will be stored in the semiconductor memory in a nonvolatile state due to the difference between said both threshold voltages.

The condition in which the information value "1" is written in the semiconductor memory of FIG. 1 is restored to the "0" condition by applying a voltage having a potential of zero to the source and drain electrodes 6 and 8 and applying a negative voltage to the gate electrode. That is, restoration to the "0" condition is executed by causing electrons injected into the electron traps of the silicon-nitride film 5 to be ejected into the substrate 1 through the oxide film 4 utilizing the tunnel effect. The MNOS memory based on the use of a writing method utilizing the tunnel effect produced as the surface potential of the substrate 1 approaches the potential of the source and drain regions 2 and 3 due to the aforesaid avalanche effect (namely, the writing method utilizing the avalanche-tunnel injection) has the following drawbacks. First, where a usual substrate having a resistivity of several ohm·cm is used, it is necessary that a large current is flowed in the source and drain junctions and also that a high writing voltage is applied to these junctions. This fact becomes a great obstruction when this type of memory is integrated into a large scale memory. Particularly, the fact that a large avalanche current is required means that when consideration is given to the number of memory elements or MOS transistors series-connected to one memory element, the construction of a large scale integrated circuit (LSI) requires an extremely high power source voltage and simultaneously imposes a limitation on the writing-in speed.

Where it is desired to eliminate the foregoing drawbacks, a substrate having as high a resistivity as, for example, approximately 200 ohm·cm can be used as the $n$-type substrate. The use of such substrate causes a large decrease in voltage due to the flow of a current produced on account of the avalanche breakdown, thereby causing the potential of the surface portion of the substrate 1 right below the gate electrode region to approach readily that of a voltage applied to the source and drain regions, so that the tunnel effect becomes likely to be easily produced. Namely, a sufficient degree of voltage decrease necessary for the required condition is attained with a slight amount of avalanche current. If the avalanche withstand voltage in the "0" condition is lower than a voltage necessary for the write operation due to the tunnel effect, the writing of information in accordance with the avalanche-tunnel injection will be executed with the substantially same level of voltage as that of a voltage necessary for the write operation due to the tunnel effect.

The use of the above-mentioned high resistivity substrate, however, produces an inconvenience in forming the peripheral circuit of the memory on the same substrate by integrated circuits. For example, in the case of the high resistivity substrate, the depletion layer is enlarged to cause an interference between the $P^+$ diffusion layers, and for the purpose of suppressing the enlargement of the depletion layer it becomes necessary to form an $n^+$ layer on the same chip by the ion implantation process in forming an LSI memory.

In order to solve the problems concerning the above-stated complication of the manufacturing process and memory construction, let us consider here what phenomena take place in effecting the writing-in of information with respect to the MNOS memory using an $n$ type substrate having a resistivity of several ohm·cm.

Where the channel length is large, the depletion layers spread from the source and drain regions 2 and 3 are spaced as indicated by dotted lines of FIG. 2 in the write operation using avalanche-tunnel injection. An avalanche current indicated by the flow of electrons in arrow-indicated directions is freely flowed in the direction of the thickness of the substrate 1, and simultaneously is flowed through the surface of the substrate 1 in the direction of the channel width as indicated by arrows $e$ of FIG. 3. For this reason, the avalanche current path is enlarged to cause a decrease in resistance, so that it becomes difficult because of a small voltage drop due to the said avalanche current that the surface potential of the substrate 1 right below the gate electrode G and in the proximity of the channel center approaches that of a voltage applied to the source and drain regions 2 and 3. Where, for example, an $n$ type substrate having a resistivity of 5 ohm·cm is used, a rectangular parallelepiped substrate having a size of 1 μm × 1 μm × 1 μm has a resistance of 50 kilo-ohm.

On the other hand, where the channel length is rendered small, a current passage extending from the surface of the substrate into the interior thereof is shielded by depletion layers spread from both the source and drain regions 2 and 3 as shown by dotted lines of FIG. 4. However, also in this case, a current passage along the direction of the channel width exists in the surface of the substrate 1 similarly to the case shown in FIGS. 2 and 3. According to experiments, in a memory 5μ in channel length and 36μ in channel width, a writing-in voltage necessary for the avalanche-tunnel injection injection is required to have a level 10 or 10-odd volts higher than a voltage necessary for the write operation by the usual tunnel injection, and an avalanche current flowed at this time in the source and drain junctions is required to be about 1 to several milliamperes. Further, in a memory large in channel width, a clear difference is considered to be produced between the proximity of the center of the gate electrode and the proximity of the end portions of the gate as viewed in the direction of the channel width, in respect of the amount of electrons injected into the traps due to the voltage reduction caused by the current flow. This can be confirmed by the fact that, according to experiments, the MNOS memory has a smaller mutual conductance $gm$ after the write operation by the avalanche-tunnel injection than after the usual write operation executed by applying a positive voltage to the gate electrode with respect to the substrate, and it is substantiated from the above that the foregoing consideration is qualitatively right.

This invention has been achieved in accordance with the foregoing consideration and is intended to provide a non-volatile semiconductor memory by means of avalanche-tunnel injection which only requires a smaller amount of avalanche current necessary for the write operation and a lower level of voltage necessary therefor.

This invention provides a nonvolatile semiconductor memory which is constructed such that during the write operation, a substrate portion below a substrate surface region right below the gate electrode is shielded by a depletion layer spread from the source and drain regions and simultaneously portions of said substrate surface region along the direction of the channel width are also shielded by depletion layers as above spread or by channels formed separately, thereby isolating said substrate surface region from the remaining substrate portion to increase a resistance for the avalanche current, thus causing the potential of the central portion of the surface region to readily approach that of the source and drain regions due to the action of only a small amount of current.

This invention can be more fully understood from the following detailed description when taken in conjunction with the accompanying drawings, in which.

Figure 7:
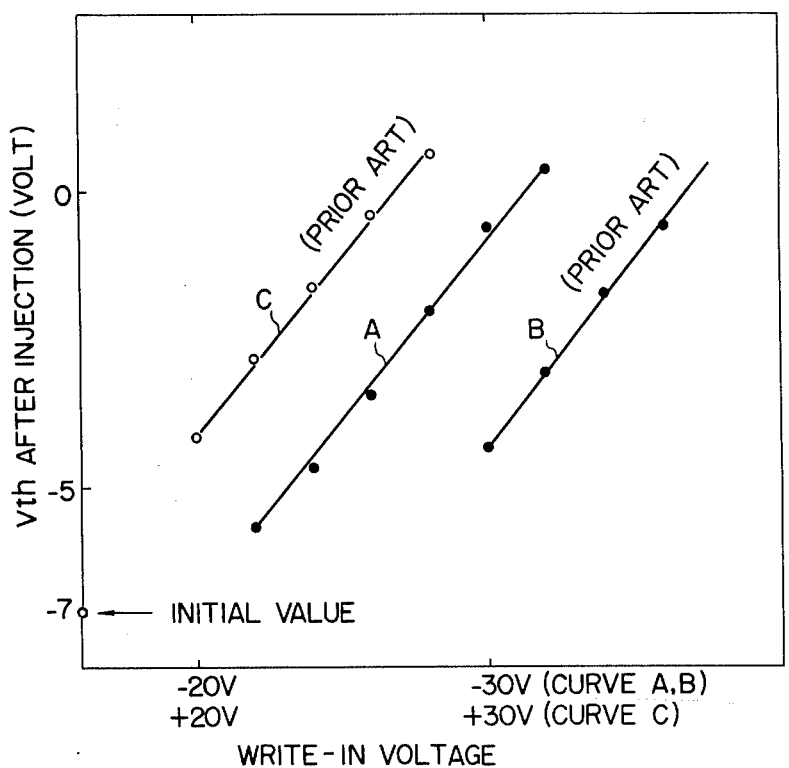
Figure 8:
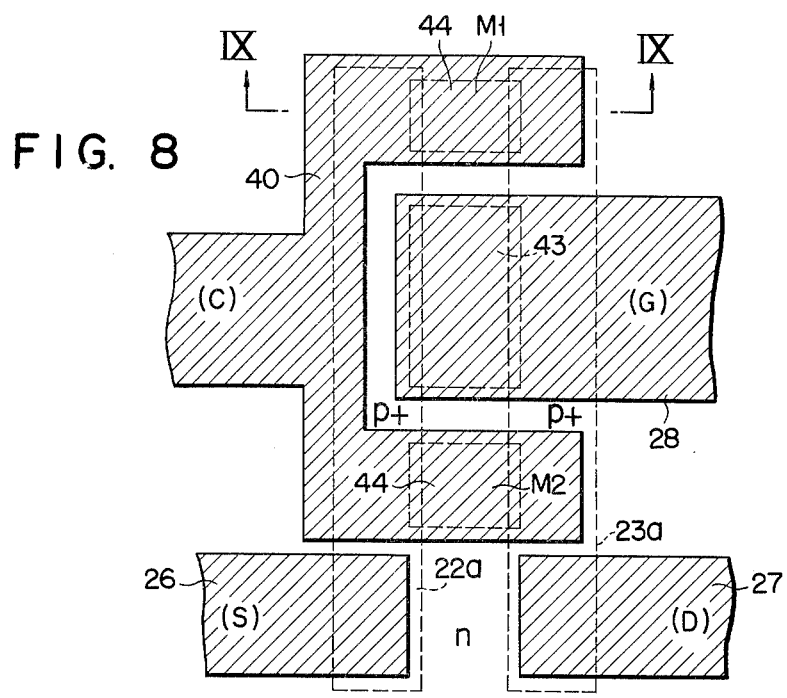
Figure 9:
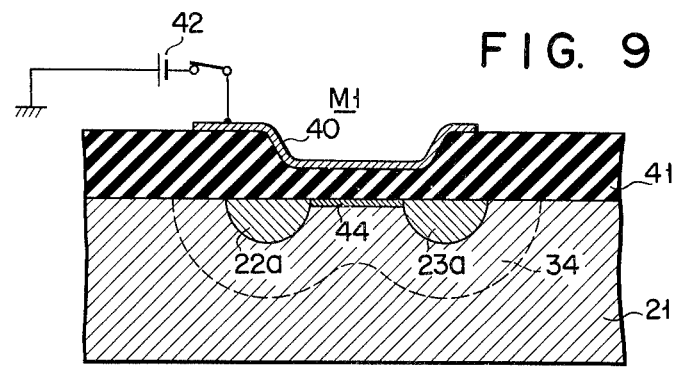
Figure 10:
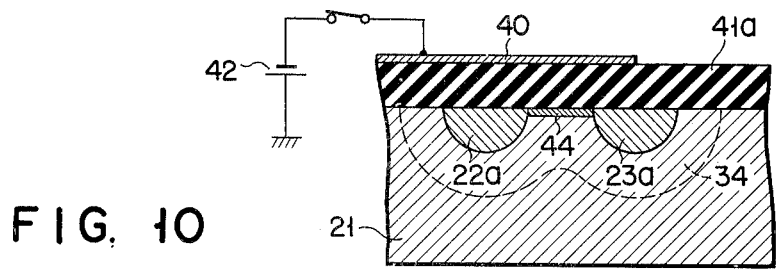

FIG. 7 graphically shows the relationship between the writing voltage value and the threshold voltage value after completion of the write operation, with respect to the present memory and the prior art memory;

FIG. 8 is a plan view of a memory according to another embodiment of the invention;

FIG. 9 is a sectional view taken along the line IX—IX of FIG. 8 as viewed in an arrow-indicated direction; and FIG. 10 is a sectional view illustrating the main part of a modification according to the embodiment of FIG. 8.

Figure 5:
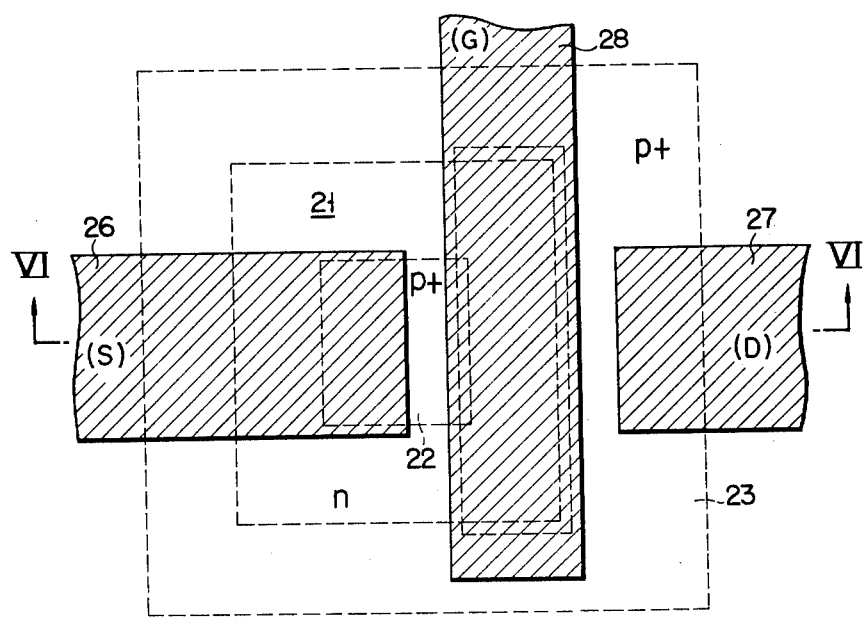
FIG. 5 is a plan view of a nonvolatile semiconductor memory according to an embodiment of the invention.
Figure 6:
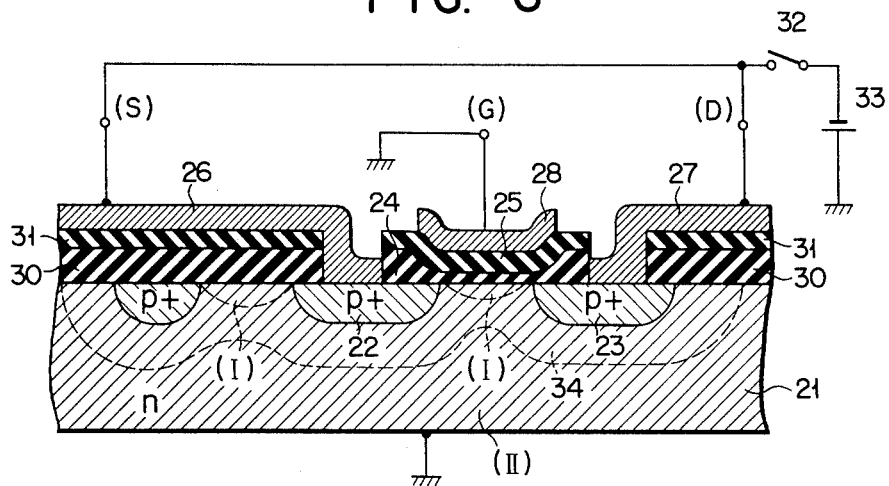
FIG. 6 is a sectional view taken along the line VI—VI of FIG. 5.

Referring to FIGS. 5 and 6, an island-shaped $p^+$ type source region 22 and an annular $p^+$ type drain region 23 enclosing said source region 22 are formed in an $n$ type silicon substrate 21 having a resistance of several, for example, 5 ohm·cm by the conventional process. An silicon oxide layer 24 having an extremely small thickness of less than 35 angstroms, or preferably less than 20 angstroms and a silicon nitride film 25 having a thickness of, for example, 500 angstroms are laminated in turn on a prescribed portion between the source region 22 and the drain region 23 in a manner bridged therebetween. Further, a source electrode 26, drain electrode 27 and gate electrode 28 are arranged in the illustrated form. Thus is formed an MNOS memory. The surface of the substrate 21 is insulated from the source electrode 26 and from the drain electrode 27, respectively, by a laminated mass consisting of an silicon oxide layer 30 and a silicon nitride layer 31.

For the purpose of effecting the avalanche-tunnel injection in the above-constructed MNOS memory, the gate electrode 28 and the substrate 21 are respectively grounded as shown in FIG. 6, and a switch 32 is closed to apply a negative voltage to both the source and drain electrodes 26 and 27 from a power source 33, which causes an surface avalanche breakdown near the junctions between the substrate 21 and the source region 22 and between the substrate and the drain region 23. At this time, a surface region I of the substrate 21 right below the gate layers 24 and 25 of the MNOS memory, that is, the downward directions of the channel are shielded from the remaining region II of the substrate 21 by a dotted lines-indicated depletion layer 34 spread from the source region 22 and the drain region 23. On the other hand, a portion of said surface region I along the direction of the channel width constitutes an annular closing region defined by the source and drain regions 22 and 23, so that a portion of said surface region I right below the gate electrode 28 is also wholly isolated from the substrate region II by the depletion layer. Accordingly, the resistance of the substrate 21 for an avalanche current flowed from the region I to the region II due to the avalanche breakdown taking place in the source and drain junctions becomes extremely high, so that the voltage drop sufficient to permit the potential of the region I to approach that of the source and drain regions can readily be attained by the decrease in the write voltage 34 and the decrease in the amount of a current flowed in the depletion layer 34. That is, the writing of information by the avalanche-tunnel can be executed with a small amount of current and a low level of voltage.

Figure 1:
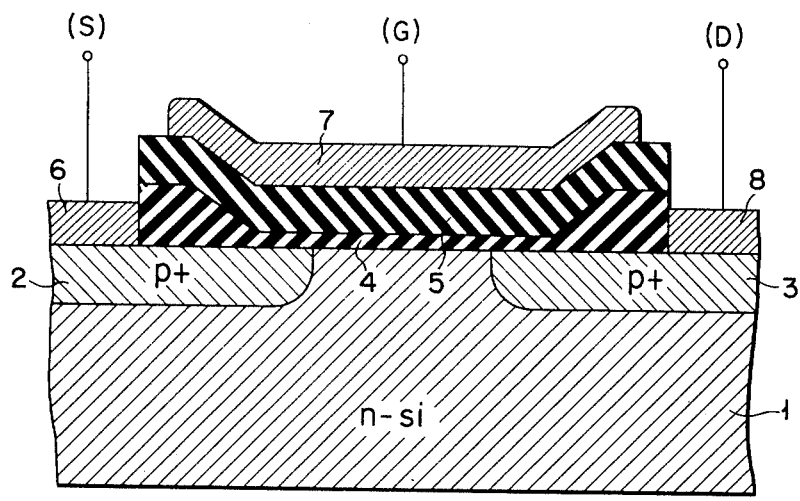
FIG. 1 is a sectional view illustrating the construction of a prior art MNOS memory.
Figure 2:
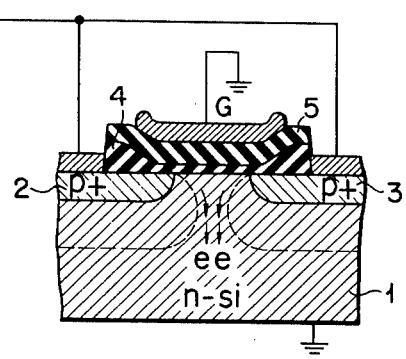
FIG. 2 is a sectional view for explaining the flow of an avalanche current in effecting the writing of information in a prior art memory shown in FIG. 3, taken along the line II—II of FIG. 3.
Figure 3:
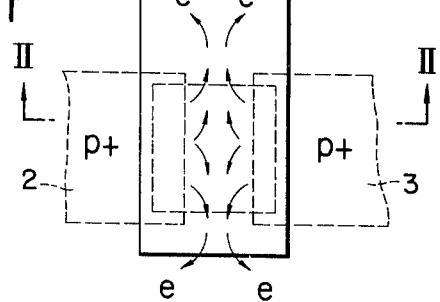
FIG. 3 is a plan view of said prior art memory of FIG. 2.
Figure 4:
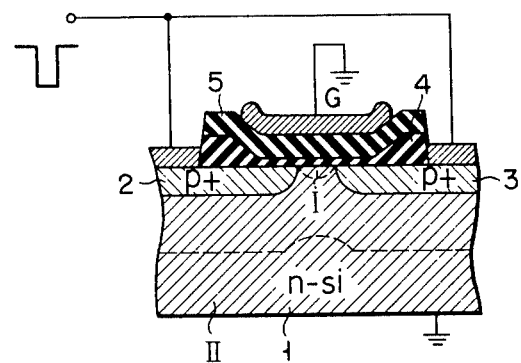
FIG. 4 is a sectional view of another memory.

Explanation will hereinafter be given of to what extent the characteristics of the semiconductor memory have actually been improved by the present invention, while comparing the experimental results concerning a prior art MNOS memory having the construction of FIG. 1 with those concerning an MNOS memory according to the embodiment shown in FIGS. 5 and 6, when said both memories being prepared on the same chip. The experiment was made for an MNOS memory which gate portion has a channel length of $5\mu$ and a channel width of $20\mu$ and which substrate has an impurity concentration of $10^{15}/cm^3$, as any of the prior art and the present MNOS memory. The silicon-oxide film and silicon-nitride film constituting the laminated insulation layer of the gate portion are respectively 15.4 Å and 400 Å thick, in which respect the present invention was made identical to the prior art.

While the substrate, source region and drain region were respectively grounded, a DC voltage of $-30$ volts was impressed upon the gate to obtain a threshold value, i.e., initial value of $-7$ volts, and thereafter the following experiments were made. The curves A, B and C of FIG. 7 respectively represent the threshold voltage values of both the prior art and the present MNOS memory after the write operations, which were executed with a voltage pulse having a pulse amplitude plotted on the abscissa and with a pulse time width of 10 microseconds, after setting said both MNOS memories at an initial value of $-7$ volts. This pulse width of 10 microseconds is obtained correspondingly to the width of a time during which the switch 32 of FIG. 6 is closed. The curve C of FIG. 7 represents the threshold voltage values of the memory after the write operation using the usual tunnel injection with a positive gate voltage pulse whose amplitude was plotted on the abscissa, and whose pulse width was 10 microseconds. In the write mode, the positive voltage pulse has been applied to the gate while the substrate, source region and drain region on either one of the prior art MNOS memory of FIG. 1 and the present MNOS memory of FIGS. 5 and 6 are respectively grounded. The characteristic indicated by the curve C applies to both of the prior art and the present MNOS memory. The curves A and B of FIG. 7 represent changes in the threshold voltages of the present and the prior art MNOS memory, respectively, after applying a negative voltage having an amplitude plotted on the abscissa and a pulse width of 10 microseconds commonly upon the drain and source regions with the gate and the substrate grounded.

As is understood from the curve C of FIG. 7, where it is desired to increase the threshold voltage up to a level of, for example, $-1$ volt, a voltage of $+25$ volts is only required for any of both memories in the case of the usual write operation by applying a positive voltage to the gate. As is understood from the curves A and B of FIG. 7, where the avalanche-tunnel injection method is utilized, the increase of the threshold voltage up to a level of $-1$ volt requires a voltage of $-29.6$ volts (see the curve A denoting the present case) and a voltage of $-35.3$ volts (see the curve B indicating the prior art case), respectively. As a result, according to the invention, reduction in writing-in voltage by the extent of approximately 5.7 volts is possible. Further, in the case of impressing a negative voltage upon the gate it is possible to execute the write operation with an increase in voltage by the extent of 4.6 volts in terms of the absolute value as compared with the case where information is written by applying a positive voltage to the gate.

In the embodiment shown in FIGS. 8 and 9, the same parts and sections as those of FIGS. 5 and 6 are denoted by the same reference numerals. This embodiment is intended to shield the substrate surface region below the gate electrode 28 along the direction of the channel width by means of two MOS transistors $M_1$ and $M_2$. That is, elongate $p^+$ type regions 22a and 23a are formed in the surface portion of the n type substrate 21, and are used as the source and drain regions, respectively. The source electrode 26 and the drain electrode 27 are respectively formed on the ends at one side of the source region 22a and drain region 23a. Another electrode 28 is formed in a manner bridged between the source region 22a and the drain region 23a, and are used as the MNOS memory gate electrode. A letter "C"-shaped electrode 40 is formed bridged between the source region 22a and the drain region 23a in a manner surrounding the gate electrode 28. Thus, said two MOS transistors $M_1$ and $M_2$ are formed in the width direction of a channel formed below the gate electrode 28.

If, in the memory constructed as mentioned above, at the time of executing the write operation using avalanche-tunnel injection, a negative voltage is impressed upon the source electrode 26 and drain electrode 27, respectively, and simultaneously upon the control gate electrode 40 of the MOS transistors $M_1$ and $M_2$ from the power source 42, the lengthwise and the downward direction of a channel 43 of the MNOS memory will be shielded by a depletion layer 34 spread from the source region 22a and drain region 23a, and the width direction of the channel 43 will be shielded by the depletion layer and the channels 44 formed below the gates of the MOS transistors $M_1$ and $M_2$, whereby a substrate surface region below the gate is shielded from the remaining portion of the substrate 21. Accordingly, similarly to the embodiment shown in FIGS. 5 and 6, the potential of a surface region of the substrate 21 beneath the gate of the MNOS memory readily approaches that of the source and drain regions due to a voltage reduction caused by an avalanche breakdown current, thereby enabling the writing-in of information by the avalanche-tunnel injection to be executed with a low level of voltage and a small amount of current.

FIG. 10 illustrates a modification of the MOS transistor $M_1$ shown in FIG. 9. Also where, in this modification, the control gate electrode 40 is formed on an insulation layer 41a having a uniform thickness, and a negative voltage is applied to the said electrode 40 from the power source 42, the formation of a depletion layer or channel is effected similarly to FIG. 9 to obtain a similar shielding effect. It should be noted that the use of a so-called parasitic MOS transistor as the foregoing MOS transistor also causes a similar effect to be obtained.

As apparent from the foregoing description, this invention enables a voltage necessary for the write operation by the avalanche-tunnel injection to be reduced as a principle in level substantially to a voltage necessary for the write operation by the tunnel injection. Further, a current necessary for the avalanche-tunnel injection has only to have a value required to charge the isolated substrate surface region beneath the gate, for example, an avalanche current value of approximately 10 microamperes. The fact that the writing-in of information can be executed with a low level of voltage and a small amount of current means that a low level of power source voltage is only required in forming a large scale integrated circuit memory and that the information writing-in speed is increased. Further, the fact that a substrate having a low specific resistance can be used is advantageous to the high density integration because of little mutual interference being made due to the spread of the depletion layer.

The nonvolatile semiconductor memory of the invention can of course be formed not only of the *p* channel MNOS memory but also of an *n*-channel MNOS memory.

What is claimed is:

1. A metal-nitride-oxide semiconductor memory device comprising:

a semiconductor *n*-type substrate;
   an elongated *p*-type source region in the surface of said substrate;
   an elongated *p*-type drain region in the surface of said substrate running parallel to said elongated source region;
   a first gate insulation film consisting of a very thin oxide film formed on a substrate surface region between said elongated source and drain regions;
   a silicon-nitride film formed on said first gate insulation film;
   first and second metal-oxide-semiconductor field-effect transistors, the source and drain of each of said transistors being said elongated source and drain regions, said transistors being positioned respectively on either side of said first gate insulation film and having respectively second and third gate insulation films between said elongated source and drain regions;
   source, drain, and first, second and third gate electrodes respectively formed on said elongated source and drain regions, and said first, second and third gate insulation films, said second and third gate electrodes being separated from said first gate electrode;
   means for effecting writing-in of information by ejecting carriers from said substrate surface region between said source and drain regions into electron traps in said silicon-nitride film;
   means for impressing ground potential to said substrate and to said first gate electrode and a predetermined negative potential to said source, drain and second and third gate electrodes so as to form a depletion layer which surrounds completely the substrate surface region under said first gate insulation film at the time of effecting writing-in of information; and
   means for allowing the potential of said substrate surface regions completely enclosed by said depletion layer to approach that of said source and drain regions by injecting carriers into said surface region.

2. A metal-nitride oxide semiconductor memory device comprising:

a semiconductor *n*-type substrate;
   an elongated *p*-type source region in the surface of said substrate;
   an elongated *p*-type drain region in the surface of said substrate running parallel to said elongated source region;
   a gate insulation film consisting of a very thin oxide film formed on a substrate surface region between said elongated source and drain regions;
   a silicon-nitride film formed on said gate insulation film;
   first and second electrode insulation films extending between said elongated source and drain regions, said first and second electrode insulation films being positioned respectively on either side of said gate insulation film;
   source, drain, gate, and first and second control electrodes respectively formed on said elongated source and drain regions, said gate and said first and second electrode insulation films, said first and second control electrodes being separated from said gate electrode;
   means for effecting writing-in of information by ejecting carriers from said substrate surface region between said source and drain regions into electron traps in said silicon-nitride film;
   means for impressing ground potential to said substrate and to said first gate electrode and a predetermined negative potential to said source, said drain and said first and second control electrodes so as to form a depletion layer which surrounds completely the substrate surface region under said gate insulation film at the time of effecting writing-in of information; and
   means for allowing the potential of said substrate surface regions completely enclosed by said depletion layer to approach that of said source and drain regions by injecting carriers into said surface region.

* * * * *